United States Patent
Jeon et al.

(10) Patent No.: US 10,216,051 B2
(45) Date of Patent: Feb. 26, 2019

(54) LIQUID CRYSTAL DISPLAY AND A METHOD OF MEASURING A CAPACITANCE OF A LIQUID CRYSTAL DISPLAY

(71) Applicant: SAMSUNG DISPLAY CO., LTD., Yongin, Gyeonggi-do (KR)

(72) Inventors: Yu-Jin Jeon, Seoul (KR); Jae-Hyun Park, Yongin-si (KR); Jae Ho Choi, Asan-si (KR); Sung Chul Hong, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 372 days.

(21) Appl. No.: 14/492,485

(22) Filed: Sep. 22, 2014

(65) Prior Publication Data
US 2015/0293387 A1  Oct. 15, 2015

(30) Foreign Application Priority Data

Apr. 10, 2014 (KR) .................. 10-2014-0042960

(51) Int. Cl.
| | |
|---|---|
| G02F 1/1345 | (2006.01) |
| G02F 1/135 | (2006.01) |
| G02F 1/13 | (2006.01) |
| G09G 3/00 | (2006.01) |
| G01R 27/26 | (2006.01) |
| G02F 1/1343 | (2006.01) |
| G02F 1/1362 | (2006.01) |

(52) U.S. Cl.
CPC ........ G02F 1/13452 (2013.01); G02F 1/1309 (2013.01); G02F 1/1345 (2013.01);
(Continued)

(58) Field of Classification Search
CPC ......... G02F 1/134309; G02F 1/134363; G02F 1/13439; G02F 1/133606; G02F 1/1368;
(Continued)

(56) References Cited

U.S. PATENT DOCUMENTS 6,747,722 B2 * 6/2004 Ono .................. G02F 1/134309
349/132
7,379,040 B2   5/2008 Kitazoe
(Continued)

FOREIGN PATENT DOCUMENTS

JP  2000-155302  6/2000
JP  2002-098998  4/2002
(Continued)

Primary Examiner — Dung Nguyen
(74) Attorney, Agent, or Firm — F. Chau & Associates, LLC (57) ABSTRACT

A liquid crystal display including: a display area which includes an upper substrate, a lower substrate, pixels and a liquid crystal layer interposed between the upper and lower substrates; and a measuring unit including a tag portion, a common voltage applying portion, and a pixel voltage applying portion, in which the common voltage applying portion and the tag portion, and the pixel voltage applying portion and the tag portion are connected to each other, a data conductor, a common electrode, a passivation layer, and a pixel electrode are disposed on the common voltage applying portion with substantially the same thickness as at least one of the pixels of the display area, a first part of the data conductor of the common voltage applying portion directly contacts the pixel electrode, and a second part of the data conductor of the common voltage applying portion directly contacts the common electrode.

11 Claims, 8 Drawing Sheets

(52) U.S. Cl.
CPC ........ *G02F 1/1354* (2013.01); *G01R 27/2605* (2013.01); *G02F 1/1358* (2013.01); *G02F 1/134363* (2013.01); *G02F 2001/136254* (2013.01); *G09G 3/006* (2013.01); *G09G 2300/08* (2013.01)

(58) Field of Classification Search
CPC ... G02F 1/1345; G02F 1/13452; G02F 1/1354
See application file for complete search history.

(56) References Cited

U.S. PATENT DOCUMENTS

| | | | |
|---|---|---|---|
| 7,889,302 | B2 | 2/2011 | Kim |
| 8,330,691 | B2 | 12/2012 | Tanimoto et al. |
| 2003/0227580 | A1* | 12/2003 | Ono ................. G02F 1/134363 349/43 |
| 2007/0008476 | A1* | 1/2007 | Nakanishi ......... G02F 1/134363 349/143 |
| 2012/0212684 | A1 | 8/2012 | Ochiai et al. |
| 2017/0003827 | A1* | 1/2017 | Abileah .............. G02F 1/13338 |

FOREIGN PATENT DOCUMENTS

| | | |
|---|---|---|
| JP | 2005-345547 | 12/2005 |
| JP | 2012-226156 | 11/2012 |
| KR | 10-0583979 | 5/2006 |
| KR | 10-0587369 | 6/2006 |
| KR | 10-0707034 | 4/2007 |
| KR | 1020130002703 | 1/2013 |

\* cited by examiner

LIQUID CRYSTAL DISPLAY AND A METHOD OF MEASURING A CAPACITANCE OF A LIQUID CRYSTAL DISPLAY

CROSS-REFERENCE TO RELATED APPLICATION

This application claims priority under 35 U.S.C. § 119 to Korean Patent Application No. 10-2014-0042960 filed in the Korean Intellectual Property Office on Apr. 10, 2014, the disclosure of which is incorporated by reference herein in its entirety.

TECHNICAL FIELD

The present invention relates to a liquid crystal display and a method of measuring a capacitance of a liquid crystal display.

DESCRIPTION OF THE RELATED ART

A liquid crystal display is a display device which rearranges liquid crystal molecules of a liquid crystal layer by applying voltages to electrodes to control an amount of transmitted light.

The liquid crystal display generally has a reduced thickness, but a decreased side visibility. To widen its viewing angle, a liquid crystal display in which a pixel electrode and a common electrode are formed on one substrate has been used.

In this type of liquid crystal display, at least one of two field generating electrodes of the pixel electrode and the common electrode has a plurality of cutouts, and a plurality of branch electrodes defined by the plurality of cutouts.

However, in the case of forming two field generating electrodes on one display panel, since a different photomask is used to form each field generating electrode, manufacturing costs may be increased.

SUMMARY

An exemplary embodiment of the present invention provides a liquid crystal display including: a display area which includes an upper substrate, a lower substrate, a plurality of pixels and a liquid crystal layer interposed between the upper substrate and the lower substrate; and a measuring unit including a tag portion, a common voltage applying portion, and a pixel voltage applying portion, in which the common voltage applying portion and the tag portion are connected to each other, and the pixel voltage applying portion and the tag portion are connected to each other, a data conductor, a common electrode, a passivation layer, and a pixel electrode are disposed on the common voltage applying portion with substantially the same thickness as at least one of the pixels of the display area, a first part of the data conductor of the common voltage applying portion directly contacts the pixel electrode of the common voltage applying portion, and a second part of the data conductor of the common voltage applying portion directly contacts the common electrode of the common voltage applying portion.

The display area may include a gate line and a data line positioned on the lower substrate, a thin film transistor connected to the gate line and the data line, a first passivation layer positioned on the thin film transistor, a common electrode positioned on the first passivation layer, a second passivation layer positioned on the common electrode, and a pixel electrode positioned on the second passivation layer, in which the common electrode and the second passivation layer may be simultaneously formed by using one mask.

A first edge of the common electrode and a second edge of the second passivation layer may have substantially the same planar shape, and the second edge of the second passivation layer may protrude further than the first edge of the common electrode.

The tag portion may include a common electrode, a passivation layer on the common electrode, and a pixel electrode on the passivation layer, and thicknesses of the common electrode, the passivation layer, and the pixel electrode of the tag portion may be substantially the same as the thicknesses of the common electrode, the second passivation layer, and the pixel electrode in the display area.

A pixel electrode of the pixel voltage applying portion may be connected with a pixel electrode of the tag portion.

The pixel electrode of the pixel voltage applying portion has substantially the same thickness as the pixel electrode of the display area.

The common electrode of the common voltage applying portion may be connected with a common electrode of the tag portion.

In a first part of the common voltage applying portion, the data conductor, the common electrode, the passivation layer, and the pixel electrode may be arranged, and the common electrode and the pixel electrode may be electrically insulated from each other by the passivation layer, in a second part of the common voltage applying portion, the data conductor and the pixel electrode may be arranged, and the data conductor and the pixel electrode may directly contact each other, and the pixel electrode may be formed on an entire surface of the common voltage applying portion.

The common voltage applying portion may be formed simultaneously with the display area, and thicknesses of the data conductor, the common electrode, the passivation layer, and the pixel electrode of the common voltage applying portion may be substantially the same as the thicknesses of the data conductor, the common electrode, the second passivation layer, and the pixel electrode of the display area.

A common electrode and a passivation layer may be formed in the tag portion.

Thicknesses of the common electrode and the passivation layer of the tag portion and the common voltage applying portion may be substantially the same as the thicknesses of the common electrode and the second passivation layer formed in the display area.

An exemplary embodiment of the present invention provides a method of measuring a capacitance of a liquid crystal display including: forming a common voltage applying portion, a pixel voltage applying portion, and a tag portion in an area separate from a display area; supplying a common voltage to the common voltage applying portion and a pixel voltage to the pixel voltage applying portion; and measuring a capacitance formed at the tag portion by the common voltage and the pixel voltage.

The common voltage applying portion, the pixel voltage applying portion, and the tag portion may be formed by the same process used to form the display area.

A data conductor, a common electrode, a passivation layer, and a pixel electrode of the common voltage applying portion may have substantially the same thickness as a pixel of the display area, a first part of the data conductor of the common voltage applying portion may directly contact the pixel electrode of the common voltage applying portion, and a second part of the data conductor of the common voltage applying portion may directly contact the common electrode of the common voltage applying portion.

Different voltages may be supplied to the common voltage applying portion and the pixel voltage applying portion.

The pixel voltage applied to the pixel voltage applying portion may be supplied to a pixel electrode positioned on an upper surface of the pixel voltage applying portion, and transferred to a pixel electrode of the tag portion along a line connecting the pixel electrode of the pixel voltage applying portion and the pixel electrode of the tag portion.

The common voltage applied to the common voltage applying portion may be supplied to the pixel electrode positioned on an upper surface of the common voltage applying portion, the common voltage may be supplied to the data conductor contacting the pixel electrode positioned on the upper surface of the common voltage applying portion, the common voltage may be again supplied to the common electrode of the common voltage applying portion contacting the data conductor, and the common voltage may be transferred to a common electrode of the tag portion along a line connecting the common electrode of the common voltage applying portion and the common electrode of the tag portion.

The measurement of the capacitance may be performed by a measuring device connected with the common voltage applying portion and the pixel voltage applying portion.

The tag portion may include a common electrode, a pixel electrode, and a passivation layer positioned between the common electrode and the pixel electrode, and thicknesses of the common electrode, the pixel electrode, and the passivation layer of the tag portion may be substantially the same as thicknesses of a common electrode, a passivation layer, and a pixel electrode of the display area.

An exemplary embodiment of the present invention provides a liquid crystal display including: a substrate; a data line disposed on the substrate; a common electrode directly connected to a first portion of the data line; a pixel electrode directly connected to a second portion of the data line; and a passivation layer disposed between the common electrode and the pixel electrode.

DETAILED DESCRIPTION OF THE EMBODIMENTS

Exemplary embodiments of the present invention will be described more fully hereinafter with reference to the accompanying drawings. However, the described embodiments may be modified in various different ways, and should not be construed as limited to the embodiments disclosed herein.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

Hereinafter, a liquid crystal display according to an exemplary embodiment of the present invention will be described in detail with reference to the accompanying drawings.

Figure 1:
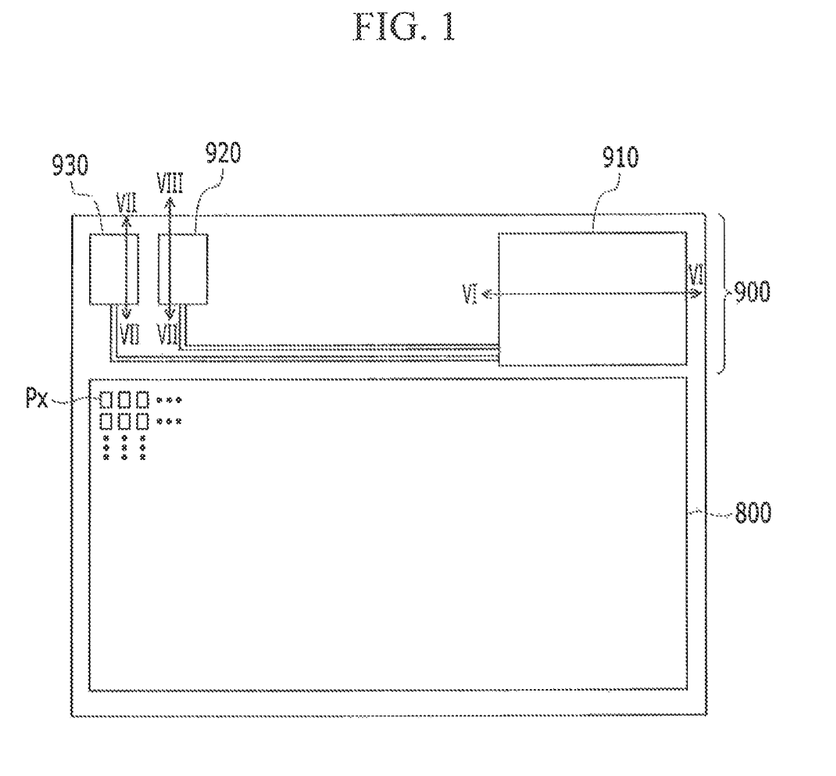
FIG. 1 is a diagram illustrating a liquid crystal display according to an exemplary embodiment of the present invention.

FIG. 1 is a diagram illustrating a liquid crystal display according to an exemplary embodiment of the present invention. Referring to FIG. 1, the liquid crystal display is divided into a display area 800 in which a plurality of pixels Px is formed and an image is displayed, and a measuring unit 900 for measuring a capacitance of the liquid crystal display. The measuring unit 900 includes a tag portion 910, a common voltage applying portion 920, and a pixel voltage applying portion 930.

Next, the display area 800 will be described.

Figure 2:
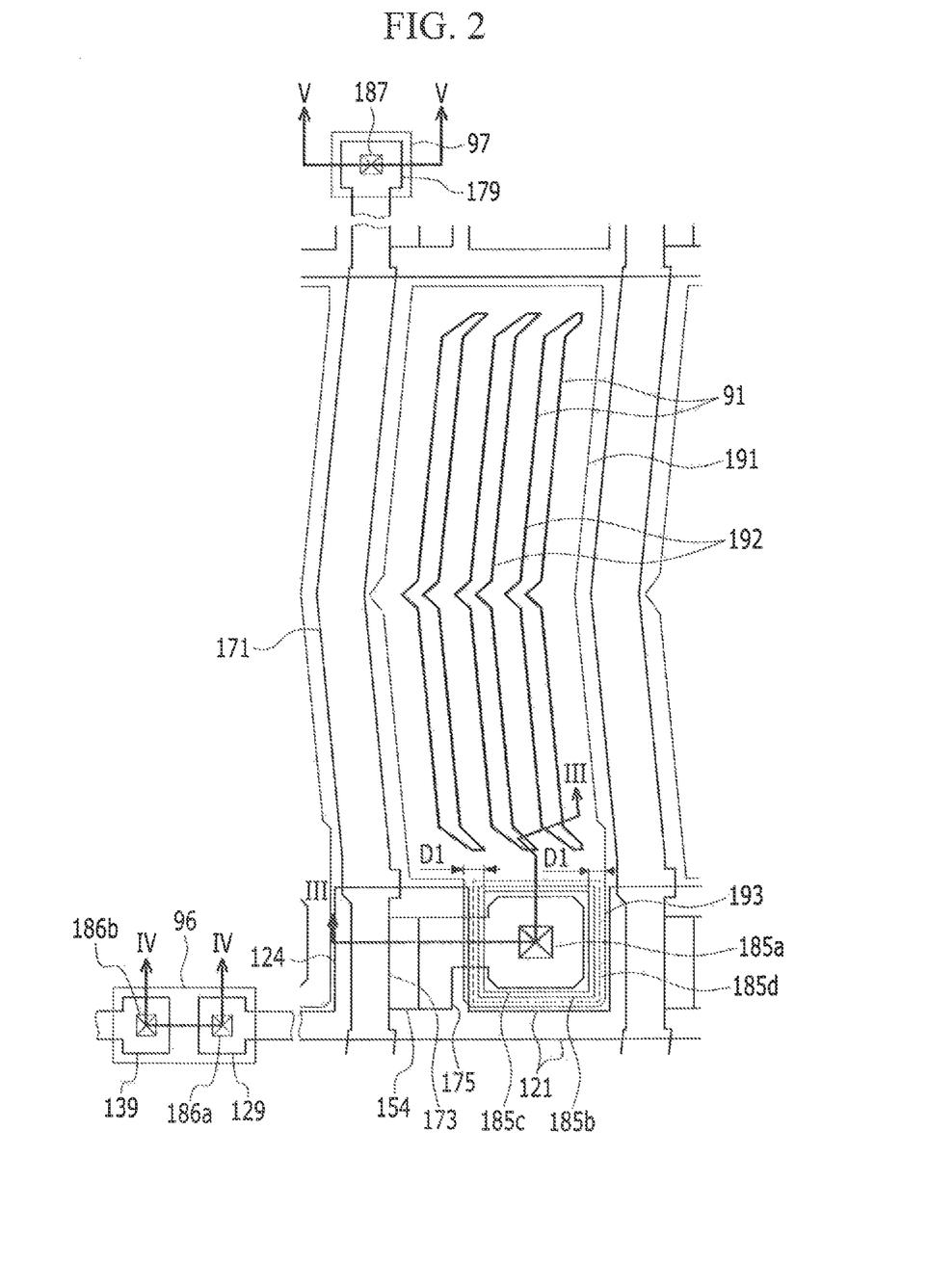
FIG. 2 is a layout view of the liquid crystal display of FIG. 1.
Figure 3:
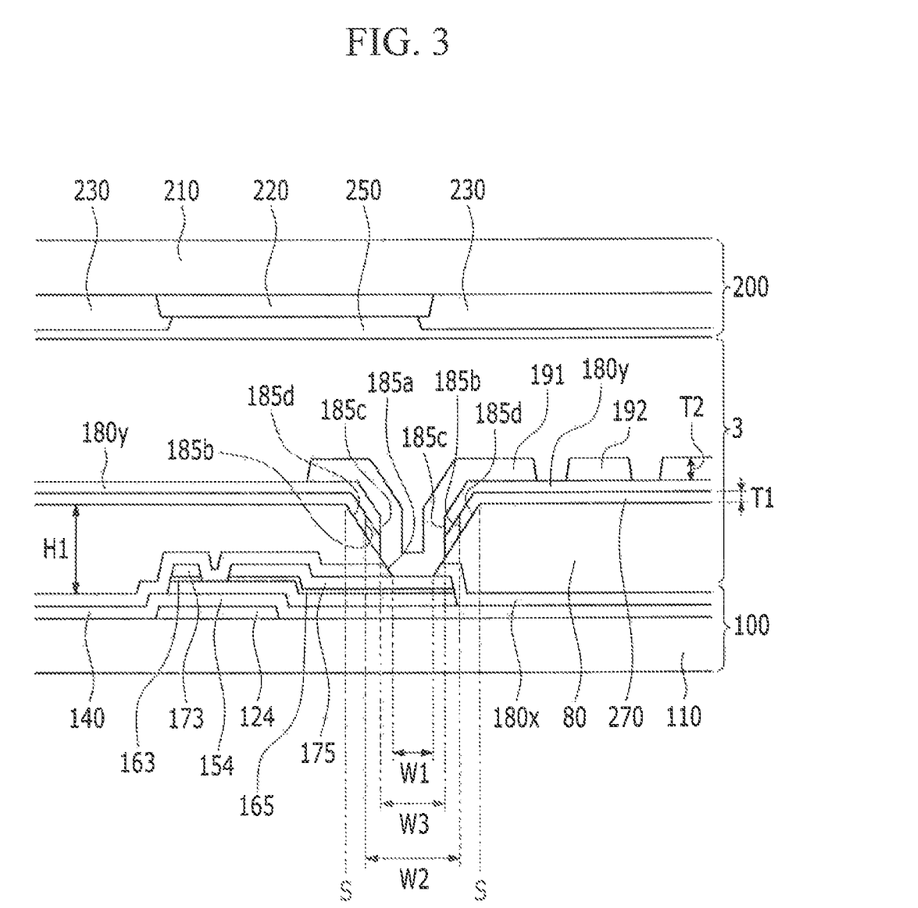
FIG. 3 is a cross-sectional view of the liquid crystal display of FIG. 2 taken along line III-III.
Figure 4:
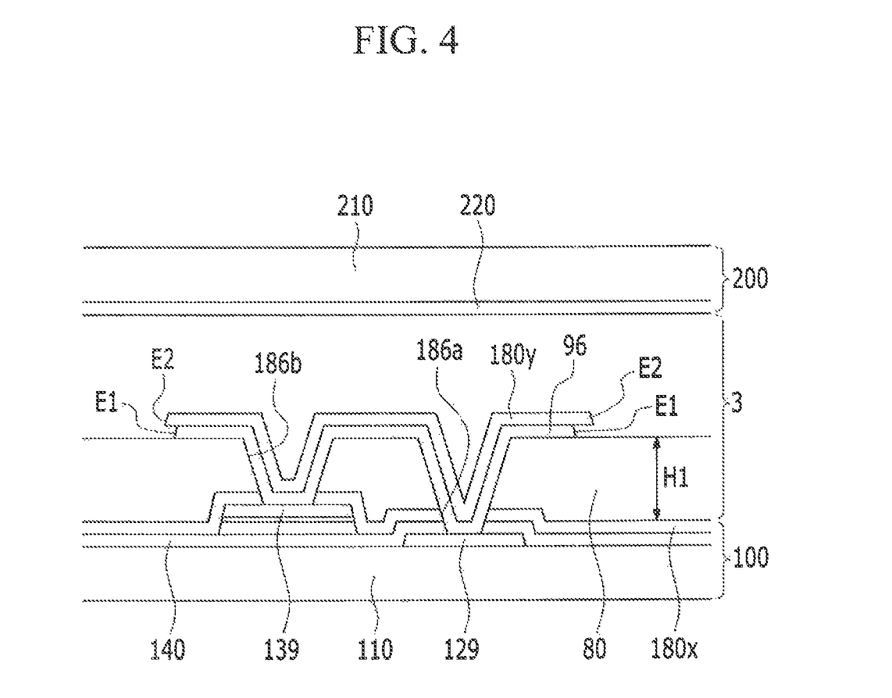
FIG. 4 is a cross-sectional view of the liquid crystal display of FIG. 2 taken along line IV-IV.
Figure 5:
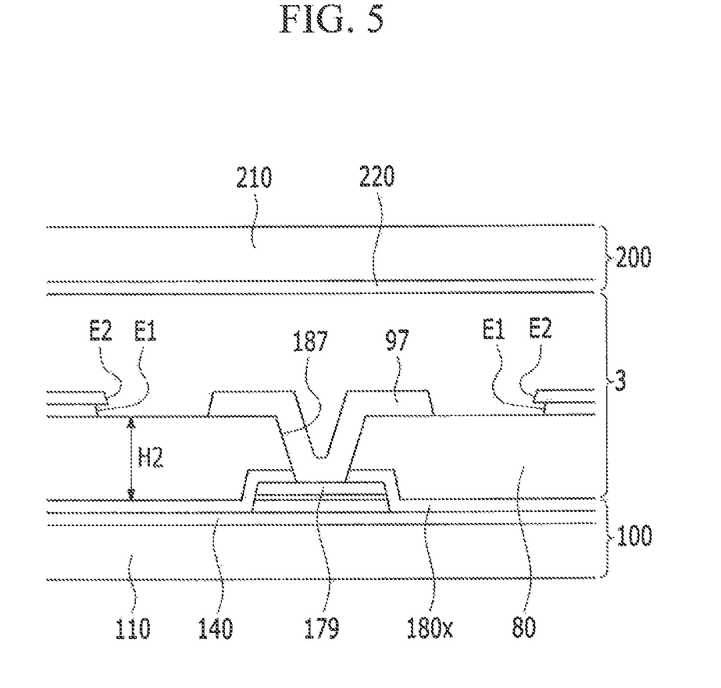
FIG. 5 is a cross-sectional view of the liquid crystal display of FIG. 2 taken along line V-V.

First, the display area 800 of the liquid crystal display of FIG. 1 will be described with reference to FIGS. 2 to 5. FIG. 2 is a layout view of the liquid crystal display of FIG. 1, FIG. 3 is a cross-sectional view illustrating the liquid crystal display of FIG. 2 taken along line III-III, FIG. 4 is a cross-sectional view of the liquid crystal display of FIG. 2 taken along line IV-IV, and FIG. 5 is a cross-sectional view of the liquid crystal display of FIG. 2 taken along line V-V.

Referring to FIGS. 2 to 5, the display area 800 of the liquid crystal display of FIG. 1 includes a lower panel 100 and an upper panel 200 facing each other, and a liquid crystal layer 3 injected therebetween.

First, the lower panel 100 will be described.

A gate conductor including a gate line 121 is formed on a first substrate 110 made of transparent glass, plastic, or the like.

The gate line 121 includes a gate electrode 124 and a wide gate pad portion 129 for connecting with another layer or an external driving circuit. The gate line 121 may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. However, the gate line 121 may have a multilayered structure including at least two conductive layers having different physical properties.

A gate insulating layer 140 made of silicon nitride (SiNx), silicon oxide (SiOx), or the like is formed on the gate conductors 121, 124, and 129. The gate insulating layer 140 may have a multilayered structure including at least two insulating layers having different physical properties.

A semiconductor 154 made of amorphous silicon, polysilicon, or the like is formed on the gate insulating layer 140. The semiconductor 154 may include an oxide semiconductor.

Ohmic contacts 163 and 165 are formed on the semiconductor 154. The ohmic contacts 163 and 165 may be made of a material such as n+ hydrogenated amorphous silicon in which an n-type impurity such as phosphorus is doped at a high concentration, or silicide. The ohmic contacts 163 and 165 may form a pair on the semiconductor 154. In the case where the semiconductor 154 is the oxide semiconductor, the ohmic contacts 163 and 165 may be omitted.

A data conductor including a data line 171 including a source electrode 173 and a drain electrode 175 is formed on the ohmic contacts 163 and 165 and the gate insulating layer 140.

The data line 171 includes a wide data pad portion 179 for connecting with another layer or an external driving circuit. The data line 171 transfers a data signal and mainly extends in a vertical direction to cross the gate line 121.

In this case, the data line 171 may have a first curved portion having a curved shape and a second curved portion having a curved shape to obtain a maximum transmittance of the liquid crystal display, and the curved portions meet each other in a middle region of the pixel area to have a V-lettered shape. The second curved portion forms a predetermined angle with the first curved portion in the middle region of the pixel area.

The source electrode 173 is a part of the data line 171, and disposed on the same line as the data line 171. The drain electrode 175 is formed to extend in parallel with the source electrode 173. Accordingly, the drain electrode 175 is parallel with a part of the data line 171.

The gate electrode 124, the source electrode 173, and the drain electrode 175 form one thin film transistor (TFT) together with the semiconductor 154, and a channel of the TFT is formed in the semiconductor 154 between the source electrode 173 and the drain electrode 175.

The liquid crystal display according to the present exemplary embodiment includes the source electrode 173 positioned on the same line as the data line 171 and the drain electrode 175 extending in parallel with the data line 171, and as a result, a width of the TFT may be increased while an area occupied by the data conductor 139, 171, 173, 175, and 179 is not increased, thereby increasing an aperture ratio of the liquid crystal display.

However, in a liquid crystal display according to an exemplary embodiment of the present invention, the source electrode 173 and the drain electrode 175 may have different shapes.

The data line 171 and the drain electrode 175 may be made of a refractory metal such as molybdenum, chromium, tantalum, and titanium or an alloy thereof, and may have a multilayered structure including a refractory metal layer (not illustrated) and a low resistive conductive layer (not illustrated). An example of the multilayered structure may include a double layer of a chromium or molybdenum (alloy) lower layer and an aluminum (alloy) upper layer, or a triple layer of a molybdenum (alloy) lower layer, an aluminum (alloy) middle layer, and a molybdenum (alloy) upper layer. However, the data line 171 and the drain electrode 175 may be made of various metals or conductors other than the aforementioned metals and conductors.

At a portion adjacent to the gate pad portion 129, a gate signal transfer pad portion 139 formed on the same layer as the data line 171 is formed.

The gate signal transfer pad portion 139 transfers a gate signal to the gate line 121 from a gate driver through the gate pad portion 129.

A first passivation layer 180x is positioned on the data conductor 139, 171, 173, 175, and 179, the gate insulating layer 140, and an exposed portion of the semiconductor 154. The first passivation layer 180x may be made of an organic insulating material, an inorganic insulating material, or the like.

An organic layer 80 is disposed on the first passivation layer 180x. The organic layer 80 has a thickness larger than that of the first passivation layer 180x and may have a flat surface.

A first thickness H1 of the organic layer 80 positioned in the display area 800 for displaying an image in which the plurality of pixels Px is positioned may be larger than a second thickness H2 of the organic layer 80 positioned in an area in which the data pad portion 179 is formed.

In a liquid crystal display according to an exemplary embodiment of the present invention, the organic layer 80 may be omitted. In a liquid crystal display according to an exemplary embodiment of the present invention, the organic layer 80 may be a color filter, and in this case, a layer disposed on the organic layer 80 may be further included. For example, a capping layer disposed on the color filter for preventing a pigment of the color filter from flowing into the liquid crystal layer 3 may be further included, and the capping layer may be made of an insulating material such as silicon nitride (SiNx).

The organic layer 80 and the first passivation layer 180x have a first contact hole 185a exposing a part of the drain electrode 175. The organic layer 80, the first passivation layer 180x, and the gate insulating layer 140 have a first pad portion contact hole 186a exposing the gate pad portion 129, and the organic layer 80 and the first passivation layer 180x have a second pad contact hole 186b exposing the gate signal transfer pad portion 139. Further, the organic layer 80 and the first passivation layer 180x have a third pad contact hole 187 exposing the data pad portion 179.

A common electrode 270 is formed on the organic layer 80. The common electrode 270 as a planar shape may be formed on the entire surface of the first substrate 110 in a whole plate, and has a second drain contact hole 185b formed in a region corresponding to a periphery of the drain electrode 175.

The common electrodes 270 positioned at adjacent pixels Px are connected to each other to receive a common voltage having a predetermined magnitude supplied from the outside of the display area 800.

A connecting member 96 is formed on the first pad contact hole 186a and the second pad contact hole 186b exposing the gate pad portion 129 and the gate signal transfer pad portion 139, respectively.

The connecting member 96 connects the gate pad portion 129 and the gate signal transfer pad portion 139 exposed by the first pad contact hole 186a and the second pad contact hole 186b to transfer a gate signal from the gate signal transfer pad portion 139 to the gate pad portion 129, and as a result, the gate signal is transferred to the gate line 121 connected to the gate pad portion 129.

The connecting member 96 is formed on the same layer as the common electrode 270 at the same time. The common electrode 270 and the connecting member 96 are formed as a transparent conductive layer such as indium tin oxide (ITO) or indium zinc oxide (IZO).

A second passivation layer 180y is formed on the common electrode 270 and the connecting member 96.

The second passivation layer 180y may be made of an organic insulating material, an inorganic insulating material, or the like.

The second passivation layer 180y has a third drain contact hole 185c formed in an area corresponding to a periphery of the drain electrode 175.

The common electrode 270 and the second passivation layer 180y have substantially the same planar shape. In more detail, when the liquid crystal display is viewed from the top, shapes formed by edges of the common electrode 270 and the second passivation layer 180y are substantially the same as each other.

A size and a width of the second drain contact hole 185b of the common electrode 270 are larger than a size and a width of the third drain contact hole 185c of the second passivation layer 180y.

A second edge E2 of the second passivation layer 180y protrudes further than a first edge E1 of the common electrode 270. In more detail, when the liquid crystal display is viewed from the top, the second edge E2 of the second passivation layer 180y has a shape which is extended further from the first edge E1 of the common electrode 270.

The second passivation layer 180y and the common electrode 270 are positioned in the display area 800 where the plurality of pixels Px is positioned, and may not be positioned in a peripheral area where the gate pad portion 129 and the data pad portion 179 are formed.

In the illustrated exemplary embodiment, the connecting member 96 formed on the gate pad portion 129 and the gate signal transfer pad portion 139 is formed on the same layer as the common electrode 270, but the connecting member 96 may be formed on the same layer as a pixel electrode 191, like contact assistant 97 to be described below.

The pixel electrode 191 is formed on the second passivation layer 180y. The pixel electrode 191 includes curved edges which are substantially parallel with the first curved portion and the second curved portion of the data line 171. The pixel electrode 191 has a plurality of cutouts 91, and includes a plurality of branch electrodes 192 defined by the plurality of cutouts 91.

The pixel electrode 191 includes an extension 193 extended toward the drain electrode 175, and the extension 193 of the pixel electrode 191 is physically and electrically connected with the drain electrode 175 through the first drain contact hole 185a, the second drain contact hole 185b, and the third drain contact hole 185c to receive a data voltage from the drain electrode 175.

The contact assistant 97 is formed on the data pad portion 179 exposed by the third pad contact hole 187. The contact assistant 97 compensates for adhesion with the data pad portion 179 and an external device and protects the data pad portion 179 and the external device.

The pixel electrode 191 and the contact assistant 97 are formed as a transparent conductive layer such as ITO or IZO. Thicknesses of the pixel electrode 191 and the contact assistant 97 are larger than those of the common electrode 270 and the connecting member 96. In more detail, a fourth thickness T2 of the pixel electrode 191 is larger than a third thickness T1 of the common electrode 270, and the fourth thickness T2 may be about two times or more larger than the third thickness T1. For example, the pixel electrode 191 and the contact assistant 97 may have thicknesses of about 900 Å.

Although not illustrated, a first alignment layer is coated on the pixel electrode 191 and the second passivation layer 180y which is not covered by the pixel electrode 191, and the first alignment layer may be a horizontal alignment layer, and is rubbed in a predetermined direction. However, in a liquid crystal display according to an exemplary embodiment of the present invention, the first alignment layer may include a photoreactive material to be photo-aligned.

Next, the upper panel 200 will be described.

A light blocking member 220 is formed on a second substrate 210 made of transparent glass, plastic, or the like. The light blocking member 220 is called a black matrix and blocks light leakage.

Further, a plurality of color filters 230 is formed on the second substrate 210.

An overcoat 250 is formed on the color filter 230 and the light blocking member 220. The overcoat 250 may be made of an organic insulator, prevents the color filter 230 from being exposed, and provides a flat surface. The overcoat 250 may be omitted.

Although not illustrated, a second alignment layer is coated on the overcoat 250, and the second alignment layer may be a horizontal alignment layer and is rubbed in a predetermined direction. However, in a liquid crystal display according to an exemplary embodiment of the present invention, the second alignment layer may include a photoreactive material to be photo-aligned.

The liquid crystal layer 3 includes a nematic liquid crystal material having positive dielectric anisotropy. The liquid crystal molecules of the liquid crystal layer 3 may be aligned so that long axes thereof are parallel to the panels 100 and 200.

The pixel electrode 191 receives a data voltage from the drain electrode 175, and the common electrode 270 receives a common voltage having a predetermined magnitude from a common voltage applying portion disposed outside of the display area 800.

The pixel electrode 191 and the common electrode 270 which are field generating electrodes generate an electric field, and thus the liquid crystal molecules of the liquid crystal layer 3 positioned on the two electrodes 191 and 270 rotate in a direction parallel to the direction of the electric field. Polarization of light passing through the liquid crystal layer 3 varies according to the rotation directions of the liquid crystal molecules.

As described above, the common electrode 270 and the second passivation layer 180y positioned on the common electrode 270 have substantially the same planar shape. Therefore, the second passivation layer 180y and the common electrode 270 may be formed together by using one photomask.

As a result, an increase in manufacturing costs of the liquid crystal display may be prevented.

Next, a drain contact portion of the liquid crystal display according to the present exemplary embodiment will be described in more detail.

The organic layer 80, the first passivation layer 180x, and the gate insulating layer 140 have the first drain contact hole 185a, the common electrode 270 has the second drain contact hole 185b, and the second passivation layer 180y has the third drain contact hole 185c.

The first drain contact hole 185a, the second drain contact hole 185b, and the third drain contact hole 185c at least partially overlap with each other.

The drain electrode 175 exposed by the overlapping portion is connected with the pixel electrode 191.

A first size and a first width W1 of the first drain contact hole 185a are smaller than a second size and a second width W2 of the second drain contact hole 185a and a third size and a third width W3 of the third drain contact hole 185c. Further, the second size and the second width W2 of the second drain contact hole 185*a* are larger than the third size and the third width W3 of the third drain contact hole 185*c*. In other words, the sizes and the widths are increased in order of the first drain contact hole 185*a*, the third drain contact hole 185*c*, and the second drain contact hole 185*b*.

Since the second size and the second width W2 of the second drain contact hole 185*b* formed in the common electrode 270 are larger than the third size and the third width W3 of the third drain contact hole 185*c* formed in the second passivation layer 180*y*, the second edge E2 of the second passivation layer 180*y* protrudes further than the first edge E1 of the common electrode 270. Accordingly, the pixel electrode 191 formed on the second passivation layer 180*y* may be prevented from being connected with the common electrode 270 formed below the second passivation layer 180*y*.

Referring to FIG. 1, a size and a width of an edge 185*d* of a slope portion where the first drain contact hole 185*a* is formed are larger than the second size and the second width W2 of the second drain contact hole 185*b* and the third size and the third width W3 of the third drain contact hole 185*c*.

In other words, the second drain contact hole 185*b* of the common electrode 270 and the third drain contact hole 185*c* of the second passivation layer 180*y* are positioned in the slope portion S of the first drain contact hole 185*a* formed in the organic layer 80. As a result, the pixel electrode 191 may be prevented from being disconnected due to a step generated at the contact portion by the third drain contact hole 185*c* which protrudes further than the second drain contact hole 185*b*. Further, as described above, since the fourth thickness T2 of the pixel electrode 191 is about two times larger than the third thickness T1 of the common electrode 270, the pixel electrode 191 may be prevented from being disconnected due to a step generated at the contact portion by the third drain contact hole 185*c* which protrudes further than the second drain contact hole 185*b*.

Since the fourth thickness T2 of the pixel electrode 191 is large, a distance D1 between the third drain contact hole 185*c* and the edge of the extension 193 of the pixel electrode 191 is substantially the same as the fourth thickness T2 of the pixel electrode 191.

As such, in the liquid crystal display according to the present exemplary embodiment, the second passivation layer 180*y* and the common electrode 270 are formed together by using one photomask. Thus, an increase in manufacturing cost of the liquid crystal display may be prevented and the pixel electrode 191 may be prevented from being disconnected due to a step between the second passivation layer 180*y* and the common electrode 270 at the drain contact portion.

Next, the measuring unit 900 will be described. The measuring unit 900 is positioned outside the display area 800 of the liquid crystal display, and measures performance of the liquid crystal display of the display area 800 to determine a quality of the manufactured liquid crystal display.

Referring to FIG. 1, the measuring unit 900 includes the tag portion 910 to be measured by functioning as a sample of the liquid crystal display of the display area 800, the common voltage applying portion 920 for applying a common voltage to the common electrode of the tag portion 910, and the pixel voltage applying portion 930 for applying a pixel voltage to the pixel electrode of the tag portion 910.

Figure 6:
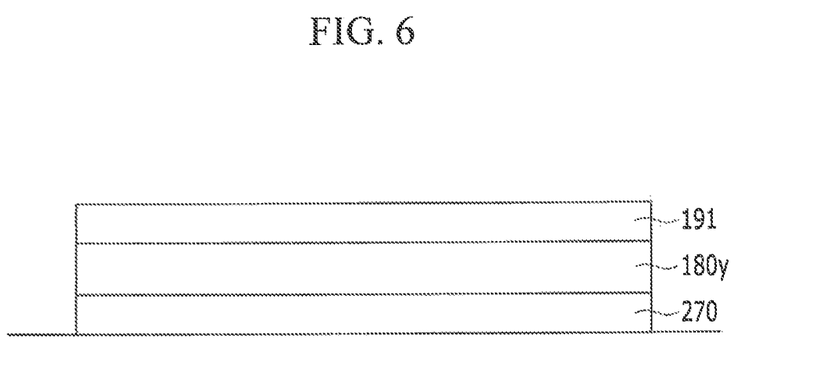
FIG. 6 is a cross-sectional view of a tag portion of FIG. 1 taken along line VI-VI, according to an exemplary embodiment of the present invention.

FIG. 6 is a cross-sectional view of the tag portion 910 of FIG. 1 taken along line VI-VI, according to an exemplary embodiment of the present invention. Referring to FIG. 6, the tag portion 910 includes the common electrode 270, the pixel electrode 191, and the second passivation layer 180*y* positioned between the common electrode 270 and the pixel electrode 191.

Since the tag portion 910 is manufactured to measure a capacitance between the common electrode and the pixel electrode of an actual liquid crystal display which is manufactured in the display area 800, a material and a thickness of the common electrode 270 of the tag portion 910, a material and a thickness of the second passivation layer 180*y* of the tag portion 910, and a material and a thickness of the pixel electrode 191 of the tag portion 910 are the same as those of the pixel electrode, the second passivation layer and the common electrode in the liquid crystal display of the display area 800.

In other words, the tag portion 910 is manufactured by a simultaneous process with the manufacturing process of the liquid crystal display of the display area 800. After the common voltage is applied to the common electrode 270 of the tag portion 910 and the pixel voltage is applied to the pixel electrode 191 of the tag portion 910, a magnitude of the capacitance generated between the common electrode 270 and the pixel electrode 191 of the tag portion 910 is measured. Without applying the voltages to the liquid crystal display which is actually manufactured in the display area 800 by such a method, the magnitude of the capacitance of the liquid crystal display of the display area 800 may be measured, and the quality of the manufactured liquid crystal display may be verified.

To apply the common voltage and the pixel voltage to the tag portion 910, the common electrode 270 of the tag portion 910 is connected with the common voltage applying portion 920, and the pixel electrode 191 is connected with the pixel voltage applying portion 930.

Figure 7:
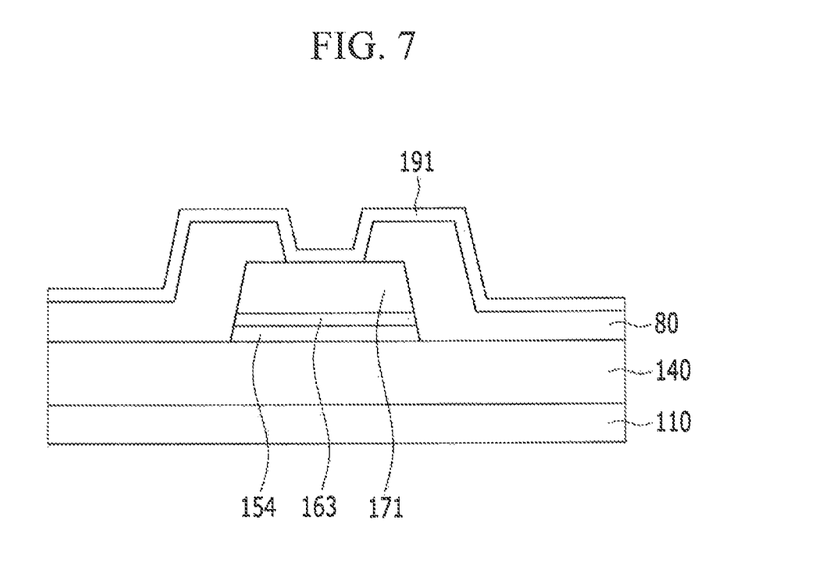
FIG. 7 is a cross-sectional view of a pixel voltage applying portion of FIG. 1 taken along line VII-VII, according to an exemplary embodiment of the present invention.

First, the pixel voltage applying portion 930 will be described. FIG. 7 is a cross-sectional view of the pixel voltage applying portion 930 of FIG. 1 taken along line VII-VII, according to an exemplary embodiment of the present invention.

Referring to FIG. 7, the pixel voltage applying portion 930 has a laminated structure including a gate insulating layer 140, a semiconductor 154, an ohmic contact 163, a data conductor 171, and a pixel electrode 191. In other words, the laminated structure of the pixel voltage applying portion 930 is similar to a laminated structure of one pixel Px of the display area 800. The pixel voltage applying portion 930 is formed by a simultaneous process when the liquid crystal display of the display area 800 is formed. Accordingly, a thickness of each layer may be the same as the thickness of their corresponding layers in the liquid crystal display of the display area 800.

When a probe for applying a voltage and the like is contacted on the pixel voltage applying portion 930, the voltage is supplied to the pixel electrode 191 of the pixel voltage applying portion 930. The pixel electrode 191 of the pixel voltage applying portion 930 is extended to the tag portion 910 to be connected with the pixel electrode 191 of the tag portion 910, and supplies the voltage to the pixel electrode 191 of the tag portion 910.

Figure 8:
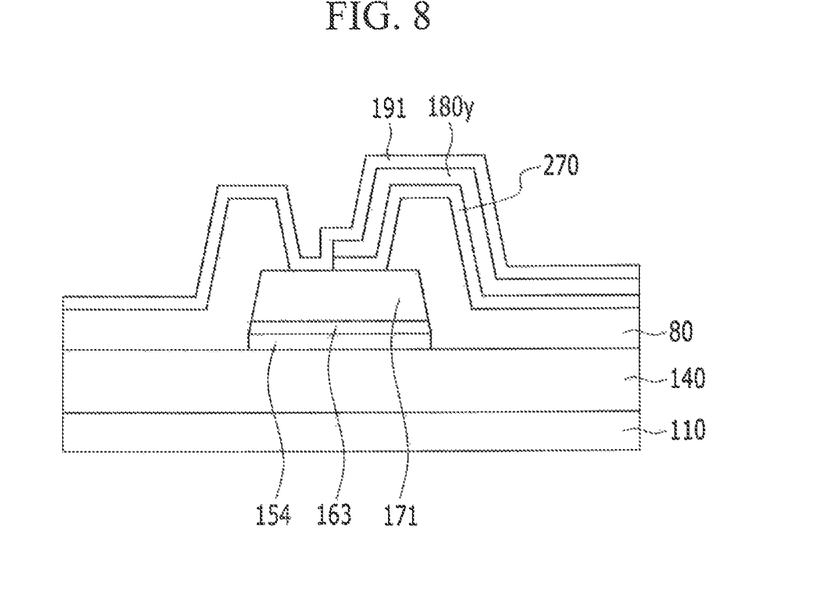
FIG. 8 is a cross-sectional view of a common voltage applying portion of FIG. 1 taken along line VIII-VIII, according to an exemplary embodiment of the present invention.

Next, the common voltage applying portion 920 will be described. FIG. 8 is a cross-sectional view of the common voltage applying portion 920 of FIG. 1 taken along line VIII-VIII, according to an exemplary embodiment of the present invention.

Referring to FIG. 8, the common electrode 270 and the second passivation layer 180*y* are formed at only a part of the common voltage applying portion 920. The rest of the elements shown in FIG. 8 are substantially the same as those shown in FIG. 7.

Figure 9:
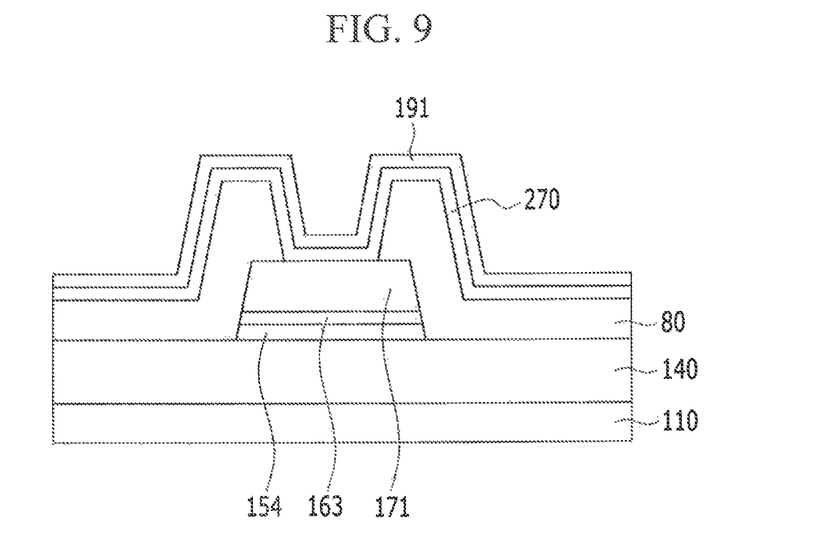
FIG. 9 illustrates a cross-sectional view of a common voltage applying portion of a liquid crystal display according to a Comparative Example.

FIG. 9 illustrates a cross-sectional view of a common voltage applying portion of a liquid crystal display according to a Comparative Example.

Referring to FIG. 9, in a common voltage applying portion of a liquid crystal display according to the Comparative Example, the elements are substantially the same as those shown in FIG. 8 except that a passivation layer is not positioned between the common electrode 270 and the pixel electrode 191. In the liquid crystal display according to the Comparative Example, since processes of forming the common electrode 270 and the pixel electrode 191 are performed by using separate masks, the passivation layer may not be formed on the common electrode 270.

Accordingly, when the common voltage is applied to the top of the common voltage applying portion of FIG. 9 by using a probe for applying the voltage and the like, the applied voltage passes through the pixel electrode 191 to be transferred to the common voltage 270 contacting the pixel electrode 191. The common electrode 270 of the common voltage applying portion is extended to be connected with the common electrode 270 of the tag portion 910, and supplies the common voltage to the common voltage 270 of the tag portion 910.

However, in the liquid crystal display according to an exemplary embodiment of the present invention, since the second passivation layer 180y and the common electrode 270 are simultaneously formed by using one mask, when the common electrode 270 exists, the second passivation layer 180y exists, and as a result, the second passivation layer 180y is always located between the common electrode 270 and the pixel electrode 191.

Accordingly, the second passivation layer 180y is located above the common electrode 270 even in the common voltage applying portion 920, and thus the common electrode 270 and the pixel electrode 191 do not directly contact each other. However, since the second passivation layer 180y is continuously formed between the common electrode 270 and the pixel electrode 191 in the common voltage applying portion 920, the voltage may not be applied to the common electrode 270.

Accordingly, in the liquid crystal display according to the present exemplary embodiment, as illustrated in FIG. 8, the common electrode 270 and the second passivation layer 180y do not entirely overlap with the pixel electrode 191, and are etched so that they are only formed on a part of the common voltage applying portion 920.

In other words, the common electrode 270 exists at only a part of the common voltage applying portion 920, and thus the pixel electrode 191 and the data conductor 171 may directly contact each other in an area that does not include the common electrode 270.

Accordingly, when the common voltage is applied to the top of the common voltage applying portion 920 by using the probe for applying the voltage and the like, the applied common voltage is transferred to the pixel electrode 191. Since the second passivation layer 180y exists between the pixel electrode 191 and the common electrode 270, the common voltage applied to the pixel electrode 191 is not directly transferred to the common electrode 270.

However, in the liquid crystal display according to the present exemplary embodiment, since the common electrode 270 does not cover the entire the data conductor 171, but covers only a part of the data conductor 171, the pixel electrode 191 contacts the data conductor 171.

Accordingly, the common voltage applied to the pixel electrode 191 is transferred to the data conductor 171, and again transferred to the common electrode 270 contacting the data conductor 171. The common electrode 270 of the common voltage applying portion 920 is extended to be connected to the common electrode 270 of the tag portion 910. Accordingly, the common voltage applied to the common voltage applying portion 920 is transferred to the common electrode 270 of the tag portion 910 through a path of the pixel electrode 191 to the data conductor 171 to the common electrode 270.

As such, in the liquid crystal display according to the present exemplary embodiment, the common electrode 270 is formed to cover only a part of the data conductor 171 in the common voltage applying portion 920, and as a result, even in the case where the common electrode 270 and the second passivation layer 180y are simultaneously formed five times with the above processes, the common voltage may be applied to the tag portion 910.

Figure 10:
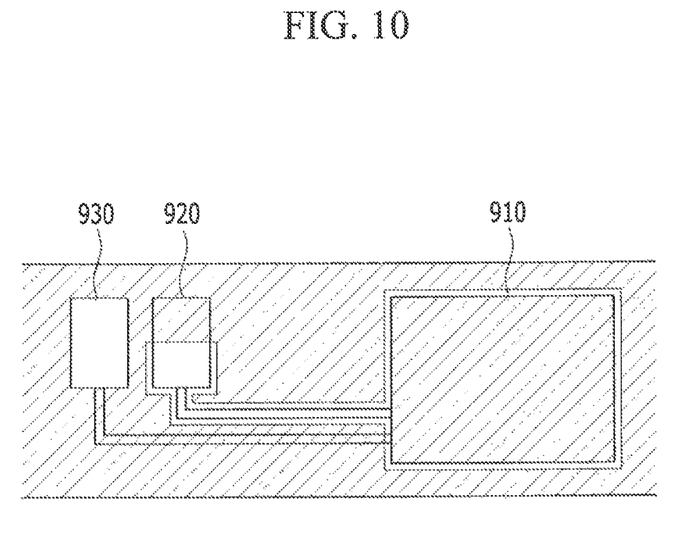
FIG. 10 illustrates a portion with a passivation layer and a common electrode and a portion without the passivation layer and the common electrode which are divided in a measuring unit of a liquid crystal display according to an exemplary embodiment of the present invention.

FIG. 10 illustrates a portion with a passivation layer 180y and a common electrode 270 and a portion without the passivation layer 180y and the common electrode 270 which are divided in the measuring unit 900 of a liquid crystal display according to an exemplary embodiment of the present invention. Referring to FIG. 10, the passivation layer 180y and the common electrode 270 do not exist at a portion illustrated by an oblique line. In other words, in the measuring unit 900, the passivation layer 180y and the common electrode 270 exist only at the portion which is not illustrated by the oblique line.

In this case, the shape of the measuring unit 900 may be manufactured by a method of etching the passivation layer 180y and the common electrode 270 at the portion illustrated by the oblique line, by using a mask having the shape illustrated by the oblique line in FIG. 10.

Next, a method of measuring a capacitance of a liquid crystal display according to an exemplary embodiment of the present invention will be described.

The method of measuring a capacitance of the liquid crystal display according to the present exemplary embodiment includes supplying a common voltage and a pixel voltage to the common voltage applying portion 920 and the pixel voltage applying portion 930, respectively, and measuring a capacitance generated in the second passivation layer 180y by the applied voltage.

First, the supplying of the common voltage and the pixel voltage to the common voltage applying portion 920 and the pixel voltage applying portion 930, respectively will be described.

In the method of measuring the capacitance, a laminated structure of the tag portion 910, the common voltage applying portion 920, and the pixel voltage applying portion 930 is the same as described above. Thus, a detailed description of the same may be omitted.

In other words, the tag portion 910 is formed by the laminated structure of the common electrode 270, the passivation layer 180y, and the pixel electrode 191 as illustrated in FIG. 6, the common electrode 270 is connected with the common electrode 270 of the common voltage applying portion 920, and the pixel electrode 191 is connected with the pixel electrode 191 of the pixel voltage applying portion 930.

In the present exemplary embodiment, the common voltage is applied to the common voltage applying portion 920, and the pixel voltage is applied to the pixel voltage applying portion 930. In this case, the application of the voltage may be performed by a method of contacting a probe for applying the voltage and the like on each applying portion. In other words, the voltage application is performed through the top of each voltage applying portion.

The pixel voltage supplied to the pixel voltage applying portion 930 is supplied to the pixel electrode 191 of the tag portion 910 via the pixel electrode 191.

In other words, the pixel voltage is transferred to the pixel electrode 191 of the pixel voltage applying portion 930 along an extended line of the pixel electrode 191 (illustrated by a line in FIG. 1 going from 930 to 910) to the pixel electrode 191 of the tag portion 910.

On the other hand, the common voltage transferred to the common voltage applying portion 920 is transferred to the common electrode 270 of the tag portion 910 through the pixel electrode 191 of the common voltage applying portion 920 and the data conductor 171 of the common voltage applying portion 920.

This will be described with reference to FIGS. 1 and 8, wherein FIG. 8 illustrates a cross-sectional view of the common voltage applying portion 920. In other words, the common voltage transferred to the common voltage applying portion 920 is transferred to the pixel electrode 191 of the common voltage applying portion 920 to the data conductor 171 of the common voltage applying portion 920 to the common electrode 270 of the common voltage applying portion 920 to a common electrode extended line (illustrated by a line in FIG. 1 going from 920 to 910) to the common electrode 270 of the tag portion 910.

By such a transfer of the voltage, an electric field is generated between the common electrode 270 and the pixel electrode 191 of the tag portion 910 illustrated in FIG. 6, and the capacitance is accumulated according to a type and a thickness of the passivation layer 180y existing between the common electrode 270 and the pixel electrode 191.

In a next step, the capacitance generated in the second passivation layer 180y by the applied voltage is measured. The capacitance may be measured by separate measuring equipment connected with each of the pixel voltage applying portion 930 and the common voltage applying portion 920. By the voltage applied to the common electrode 270 and the pixel electrode 191 of the tag portion 910, the capacitance is accumulated in the tag portion 910, and the quality of the liquid crystal display of the display area 800 may be verified by measuring the capacitance.

In other words, a value of the capacitance accumulated in the tag portion 910 varies according to a material and a thickness of the passivation layer 180y between the common electrode 270 and the pixel electrode 191.

In this case, since the tag portion 910 is formed by the same process as the liquid crystal display of the display area 800, the thickness and the material of the passivation layer 180y formed at the tag portion 910 are the same as the thickness and the material of the passivation layer 180y formed in the display area 800.

Accordingly, in the present exemplary embodiment, the quality of the liquid crystal display of the display area 800, which actually displays an image, nay be verified by the method of measuring the capacitance of the tag portion 910. In other words, when a measured capacitance of the tag portion 910 has a different value from a target value, there may have been a problem in the forming of the passivation layer 180y of the liquid crystal display in the manufacturing process. Thus, it can be easily seen if the thickness of the passivation layer 180y deviates from a normal value, and as a result, a bad liquid crystal display may be verified.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A liquid crystal display, comprising:
   a display area which includes an upper substrate, a lower substrate, a plurality of pixels and a liquid crystal layer interposed between the upper substrate and the lower substrate; and
   a measuring unit including a tag portion, a common voltage applying portion, and a pixel voltage applying portion,
   wherein the common voltage applying portion and the tag portion are connected to each other, and the pixel voltage applying portion and the tag portion are connected to each other,
   a data conductor, a first electrode, a passivation layer, and a second electrode are disposed on the common voltage applying portion,
   a first part of the data conductor of the common voltage applying portion directly contacts the second electrode of the common voltage applying portion, and
   a second part of the data conductor of the common voltage applying portion directly contacts the first electrode of the common voltage applying portion.

2. The liquid crystal display of claim 1, wherein the display area includes:
   a gate line and a data line positioned on the lower substrate,
   a thin film transistor connected to the gate line and the data line,
   a first passivation layer positioned on the thin film transistor,
   a common electrode positioned on the first passivation layer,
   a second passivation layer positioned on the common electrode, and
   a pixel electrode positioned on the second passivation layer,
   wherein the common electrode and the second passivation layer are simultaneously formed by using one mask.

3. The liquid crystal display of claim 2, wherein a first edge of the common electrode and a second edge of the second passivation layer have substantially the same planar shape, and
   the second edge of the second passivation layer protrudes further than the first edge of the common electrode.

4. The liquid crystal display of claim 2, wherein the tag portion includes a first electrode, a passivation layer on the first electrode, and a second electrode on the passivation layer, and
   thicknesses of the first electrode, the passivation layer, and the second electrode of the tag, portion are substantially the same as thicknesses of the common electrode, the second passivation layer, and the pixel electrode in the display area.

5. The liquid crystal display of claim 2, wherein a second electrode of the pixel voltage applying portion is connected with a second electrode of the tag portion.

6. The liquid crystal display of claim 5, wherein the second electrode of the pixel voltage applying portion has substantially the same thickness as the pixel electrode of the display area.

7. The liquid crystal display of claim 2, wherein in a first part of the common voltage applying portion, the data conductor, the first electrode, the passivation layer, and the second electrode are arranged, and the first electrode and the second electrode are electrically insulated from each other by the passivation layer,     in a second part of the common voltage applying portion, the data conductor and the second electrode are arranged, and     the data conductor and the second electrode directly contact each other, and the second electrode is formed on an entire surface of the common voltage applying portion.

8. The liquid crystal display of claim 7, wherein the common voltage applying portion is formed simultaneously with the display area, and     thicknesses of the data conductor, the first electrode, the passivation layer, and the second electrode of the common voltage applying portion are substantially the same as the thicknesses of the data conductor, the common electrode, the second passivation layer, and the pixel electrode of the display area.

9. The liquid crystal display of claim 2, wherein a first electrode and a passivation layer are formed in the tag portion.

10. The liquid crystal display of claim 9, wherein thicknesses of the first electrode and the passivation layer of tag portion and the common voltage applying portion are substantially the same as the thicknesses of the common electrode and the second passivation layer formed in the display area.

11. The liquid crystal display of claim 1, wherein the first electrode of the common voltage applying portion is connected with a first electrode of the tag portion.

\* \* \* \* \*